(12) United States Patent  
Anwar et al.

(10) Patent No.: US 9,425,026 B2  
(45) Date of Patent: Aug. 23, 2016

(54) SYSTEMS AND METHODS FOR IMPROVED RADIO FREQUENCY MATCHING NETWORKS

(71) Applicant: Applied Materials, Inc., Santa Clara, CA (US)

(72) Inventors: Suhail Anwar, Saratoga, CA (US); Carl A. Sorensen, Morgan Hill, CA (US); Jozef Kudela, San Jose, CA (US)

(73) Assignee: Applied Materials, Inc, Santa Clara, CA (US)

( * ) Notice: Subject to any disclaimer, the term of this patent is extended or adjusted under 35 U.S.C. 154(b) by 0 days.

(21) Appl. No.: 14/815,947

(22) Filed: Jul. 31, 2015

(65) Prior Publication Data

US 2016/0049917 A1    Feb. 18, 2016

Related U.S. Application Data

(60) Provisional application No. 62/037,917, filed on Aug. 15, 2014, provisional application No. 62/084,554, filed on Nov. 25, 2014.

(51) Int. Cl.
| | | |
|---|---|---|
| *H01J 7/24* | (2006.01) | |
| *H05B 31/26* | (2006.01) | |
| *H01J 37/32* | (2006.01) | |
| *H03H 7/40* | (2006.01) | |

(52) U.S. Cl.
CPC ..... *H01J 37/32183* (2013.01); *H01J 37/32137* (2013.01); *H03H 7/40* (2013.01); *H01J 2237/002* (2013.01); *H01J 2237/332* (2013.01); *H01J 2237/334* (2013.01)

(58) Field of Classification Search
None
See application file for complete search history.

(56) References Cited

U.S. PATENT DOCUMENTS

| | | | |
|---|---|---|---|
| 2,745,067 A | 5/1956 | True et al. | |
| 3,160,832 A | 12/1964 | Beitman, Jr. et al. | |
| 3,160,833 A | 12/1964 | Ludvigson et al. | |
| 4,375,051 A | 2/1983 | Theall | |
| 5,383,019 A | 1/1995 | Farrell et al. | |
| 5,589,844 A | 12/1996 | Belcher et al. | |
| 5,631,611 A | 5/1997 | Luu | |

(Continued)

FOREIGN PATENT DOCUMENTS

| | | |
|---|---|---|
| EP | 0825712 | 2/1998 |
| EP | 1056200 | 11/2000 |

(Continued)

OTHER PUBLICATIONS

Kudela et al., of U.S. Appl. No. 14/815,945, titled: "Compact Configurable Modular Radio Frequency Matching Network Assembly for Plasma Processing Systems," filed Jul. 31, 2015.

*Primary Examiner* — Anh Tran
(74) *Attorney, Agent, or Firm* — Dugan & Dugan, PC

(57) ABSTRACT

Systems and methods are provided for matching the impedance of a load to an impedance of a power generator. Embodiments include a matching network with a dynamically configurable component assembly array couplable to the variable impedance load and the RF power generator, wherein the component assembly array includes one or more tune and load electrical components. The component assembly array is adapted to be configured for each recipe step, and at least one of the electrical components is a variable impedance component adjustable to reduce RF energy reflected from the variable impedance load for each recipe step. Numerous other aspects are provided.

20 Claims, 5 Drawing Sheets

(56) References Cited

U.S. PATENT DOCUMENTS

| | | |
|---|---|---|
| 6,128,660 A | 10/2000 | Grimm et al. |
| 6,621,372 B2 | 9/2003 | Kondo et al. |
| 6,816,029 B2 | 11/2004 | Choi et al. |
| 6,855,225 B1 | 2/2005 | Su et al. |
| 7,518,466 B2 | 4/2009 | Sorensen |
| 7,865,154 B2 | 1/2011 | Mendolia et al. |
| 2002/0046989 A1* | 4/2002 | Blonigan .......... H01J 37/32082 219/121.43 |
| 2002/0130110 A1 | 9/2002 | Kwon et al. |
| 2003/0057844 A1 | 3/2003 | Windhorn et al. |
| 2007/0046391 A1* | 3/2007 | Sorensen .......... H01J 37/32082 333/32 |

FOREIGN PATENT DOCUMENTS

| | | |
|---|---|---|
| EP | 1237189 | 9/2002 |
| WO | WO 00/03415 | 1/2000 |

* cited by examiner

SYSTEMS AND METHODS FOR IMPROVED RADIO FREQUENCY MATCHING NETWORKS

RELATED APPLICATIONS

The present application claims priority to U.S. Provisional Application No. 62/084,554 filed Nov. 25, 2014 and titled "IMPROVED RADIO FREQUENCY MATCHING NETWORKS", and U.S. Provisional Application No. 62/037,917 filed Aug. 15, 2014 and titled "SYSTEMS AND METHODS FOR IMPROVED RADIO FREQUENCY MATCHING NETWORKS", both of which are incorporated herein by reference in their entirety for all purposes.

FIELD

The present invention relates generally to high or radio frequency matching networks and specifically to high powered matching networks for plasma processing chambers.

BACKGROUND

Referring to FIG. 1, a plasma processing system may include a high or radio frequency (hereinafter referred to as 'RF') matching network 100, a variable impedance load 102 (e.g. a plasma processing chamber), an RF generator 104, and an RF delivery system 106. The RF matching network 100 is disposed between and electrically coupled to the RF delivery system 106 and the variable impedance load 102. The RF delivery system 106 is electrically coupled to the RF generator 104. The RF matching network 100 may include electrical components typically with fixed impedance values (e.g., capacitors and/or inductors). The RF delivery system 106 may include items such as a high power coaxial cable assembly and connectors.

The RF generator 104 may provide RF energy to the variable impedance load 102 via the RF delivery system 106 and the RF matching network 100. The function of the RF matching network 100 may be to match the impedance of the variable impedance load 102 to the output impedance of the RF generator 104 and RF delivery system 106. By matching the impedance of the variable impedance load 102 to the output impedance of the RF generator 104 and the RF delivery system 106, the reflection of the RF energy from the variable impedance load 102 may be reduced. Reducing the reflection of RF energy may effectively increase the amount of RF energy provided to the variable impedance load 102 by the RF generator 104.

Conventional methods of RF matching include creating a matching network of capacitors and/or inductors with an electrical impedance that matches the variable impedance load to the output impedance of the RF generator. FIG. 2 is a more detailed schematic drawing depicting a prior art RF matching network 100. The depiction shows the arrangement of a tune component 108 and a load component 110 of the RF matching network 100.

A second conventional method of matching the impedance of the variable impedance load 102 to the impedance of the RF generator 104 may utilize variable frequency matching. The impedance presented by the RF matching network 100 to the output of the variable RF frequency generator 104 may change with the frequency. By outputting a particular frequency from the RF generator 104, the variable impedance load 102 may match the impedance of the RF generator 104 and the RF delivery system 106. This technique may be referred to as variable frequency matching. Variable frequency matching may employ an RF matching network 100 that includes fixed value tune components 108 and load components 110 (e.g. fixed value capacitors, inductors and/or resistors). The values of the tune components 108 and load components 110 may be selected to help ensure that the impedance of the RF generator 104 will match the impedance of the variable impedance load 102.

Prior art RF matching networks may help reduce the amount of energy reflected by the variable impedance load. However, the inventors of the present invention have determined that in some circumstances, existing RF matching networks may not reduce the amount of reflected energy sufficiently to avoid problems. Thus, what is needed are improved methods and apparatus for RF matching.

SUMMARY

In some embodiments, the present invention provides a system for matching the impedance of a variable impedance load of a processing chamber to an impedance of a radio frequency power generator. The system includes a radio frequency (RF) power generator; a processing chamber adapted to process recipe steps and presenting variable impedance loads corresponding to different recipe steps; and a matching network coupled to the variable impedance load and the RF power generator, wherein the matching network includes a dynamically configurable component assembly array including one or more tune and load electrical components, wherein the component assembly array is adapted to be configured for each recipe step, and at least one of the electrical components is a variable impedance component adjustable to reduce RF energy reflected from the variable impedance load for each recipe step.

In some other embodiments, the present invention provides a method for matching the impedance of a variable impedance load of a processing chamber to an impedance of a radio frequency power generator. The method includes providing a dynamically configurable matching network including a configurable component assembly array having one or more tune and load electrical components; determining a load impedance for a recipe step; configuring the matching network by coupling selected components within the component assembly array into a selected topology and adjusting the impedance of one or more of the selected components; and executing the recipe step with the configured matching network.

In yet other embodiments, the present invention provides an apparatus for matching the impedance of a variable impedance load to an impedance of a radio frequency power generator. The apparatus includes a dynamically configurable component assembly array couplable to the variable impedance load and the RF power generator, wherein the component assembly array includes one or more tune and load electrical components. The component assembly array is adapted to be configured for each recipe step, and at least one of the electrical components is a variable impedance component adjustable to reduce RF energy reflected from the variable impedance load for each recipe step.

Other features and aspects of the present invention will become more fully apparent from the following detailed description, the appended claims, and the accompanying drawings.

DETAILED DESCRIPTION

Figure 1:
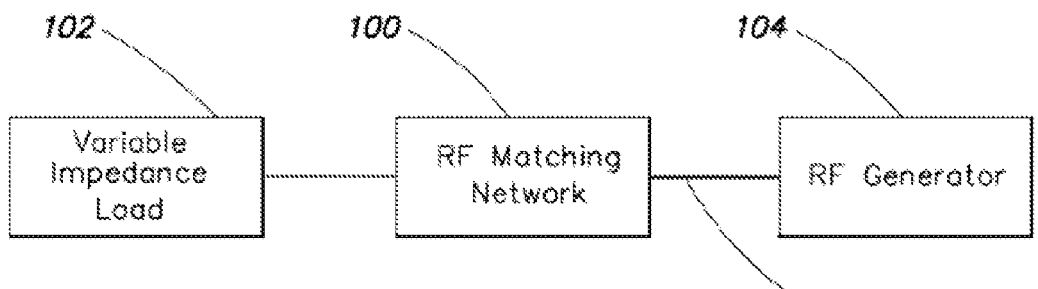
FIG. 1 is a block diagram depicting a prior art RF power system with an RF generator, an RF matching network, and a variable load.
Figure 2:
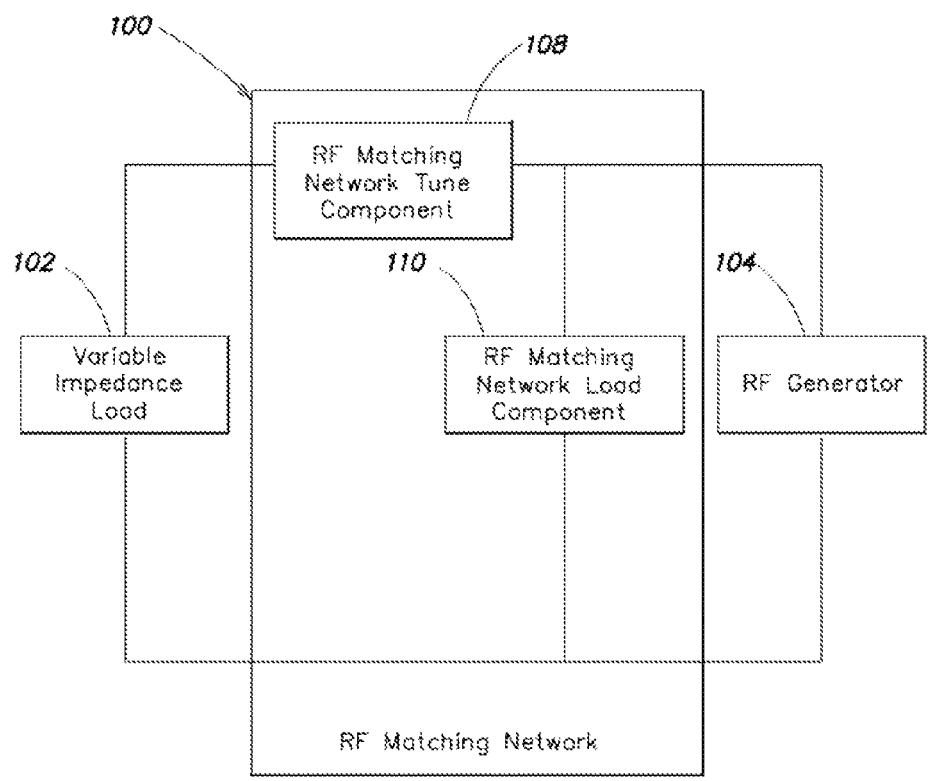
FIG. 2 is a schematic drawing illustrating details of the prior art RF matching network depicted in FIG. 1.

Impedance matching allows maximum power transfer between an RF energy source and the load. If an RF circuit is not matched, reflected power results. This reflected power builds standing waves on the transmission line between the source and load. Depending on the phase between the forward and reflected waves, both can either subtract or add to each other. As a result, there will be points on the transmission line where the voltage is doubled and eventually points where the voltage equals zero (i.e., maximum current). If a standing wave is positioned on a transmission line so that the maximum voltage or current is applied to certain electrical components, the components can be destroyed.

Substrates processed in plasma processing chambers are becoming larger. Thus, with each successive generation of technology, larger plasma processing chambers are being manufactured to accommodate the larger substrates. Due to the plasma processing chambers increasing in size, the power needed to perform the requisite processing steps (e.g., etch, deposition and/or implant) is increasing. In addition, the development of new processing techniques is resulting in much wider variations in the power requirements and impedance loads within processing recipes. The inventors of the present invention have determined that the increase in RF power and wider variations in impedance loads are not being adequately accommodated by conventional RF matching networks.

Conventionally, recipes for processing substrates in plasma processing chambers specify manufacturing conditions such as gas flow rate, gas pressure, input power, etching/deposition time, etc. Conventional matching networks used to match the load of the processing chamber to the RF power supply are designed to provide an operating range to be able to cover as wide of a plasma impedance range as practical. However, costs and other practical considerations limit the operating ranges of conventional matching networks and if a recipe calls for an input power outside of the operating range of the matching network, power loss from reflections caused by mismatch and all the attendant problems of high power standing waves can result. Thus, conventional systems must either limit the power ranges used in a recipe, or require multiple processing chambers with different matching networks for different recipe steps, or require replacing a chamber's matching network with a design that can accommodate the recipe step. Replacing a conventional matching network between recipe steps would be highly inefficient and is thus not a practicable solution for a production environment. Likewise, the throughput impact of having to transfer substrates between chambers for a single recipe plus the added cost of extra chambers can also result in an impracticable solution for production. Limiting the power ranges used in recipes can be equally undesirable since this will preclude being able to process recipes that call for wide power ranges or other manufacturing conditions with widely varying load impedance ranges. Therefore, embodiments of the present invention provide an improved matching network that can be reconfigured under the control of the processing controller to accommodate wide impedance matching requirements of individual processing recipe steps.

The dynamically configurable matching network of embodiments of the present invention allows recipe steps to specify parameters for configuring the matching network to be able to accommodate the power and other requirements of the recipe. For example, consider a simplified three step recipe that includes manufacturing conditions which result in an impedance load that is initially 2 ohms in the first recipe step, 75 ohms in the second step, and 10 ohms in the third step. Using a typical generator with a 50 ohm output impedance to create RF power at 13.56 Mhz, it may not be practical to create a conventional matching network to cover the plasma impedance range of all three recipe steps. Embodiments of the present invention however provide for: (1) recipe controlled adjusting of the impedance of the load and tune components on a per recipe step basis, (2) recipe controlled replacing of load and tune components on a per recipe step basis, and (3) recipe controlled changing of the topology of the matching network on a per recipe step basis, each to accommodate the anticipated impedance load of a given recipe step. Thus, embodiments of the present invention for example can configure a matching network using an L-topology with a 2 ohm impedance for the first recipe step; switch to a T-topology or a π-topology with a 75 ohm impedance for the second recipe step; and switch back to an L-topology with adjusted or substituted components to make a 10 ohm impedance network for the third recipe step.

In some embodiments, the dynamically configurable matching network of the present invention can use predefined network configurations that are specified as part of each recipe step. A database of pre-defined matching networks that specifies components, selectable component values, and network topologies can be used to associate pre-defined matching networks for use with specified or measured impedance loads. In some embodiments, the database can be developed empirically and in others, the values can be calculated or determined from a combination of calculation and measurements. Thus, once a recipe is specified by a user, embodiments of the invention can select an optimal matching network design for each step of the recipe. Alternatively, the user can specify all or part of the matching network configuration. Then, for each recipe step, a controller can operate actuators (e.g., servo-motors, hydraulic drivers, pneumatic cylinders, electronic solenoids, etc.) to couple/decouple and adjust components to dynamically form the selected/specified matching networks to optimally accommodate the impedance load of each recipe step.

In alternative embodiments, the system can include a feedback circuit to provide impedance load data to the processing controller and based upon this data, an optimal matching network design can be selected for each step of the recipe. In some embodiments, measured reflection data can be used as feedback to configure and adjust the matching network. Further, impedance load data and/or measured reflection data can be stored and used for feed-forward purposes to determine an optimal matching network design for subsequent runs of the recipe.

In some embodiments of the invention, the system can include a processing controller (e.g., a computer) that allows a user to specify the recipe, store the recipe, and send control signals (e.g., a power set point request) to the RF generator and the various processing chamber components to execute the recipe. In some embodiments, the match network can be configured by control signals from the processing controller directly using pre-set configurations specified by the user in the recipe or based on database look-ups in response to the recipe steps as described above. In other embodiments, the RF generator, which receives the power set point request based on the recipe from the processing controller, can include a generator controller adapted configure and control the matching network based upon impedance information available in the RF generator. In either case, the matching network is dynamically configured to optimally match the impedance load with the RF power output by the generator.

Figure 3A:
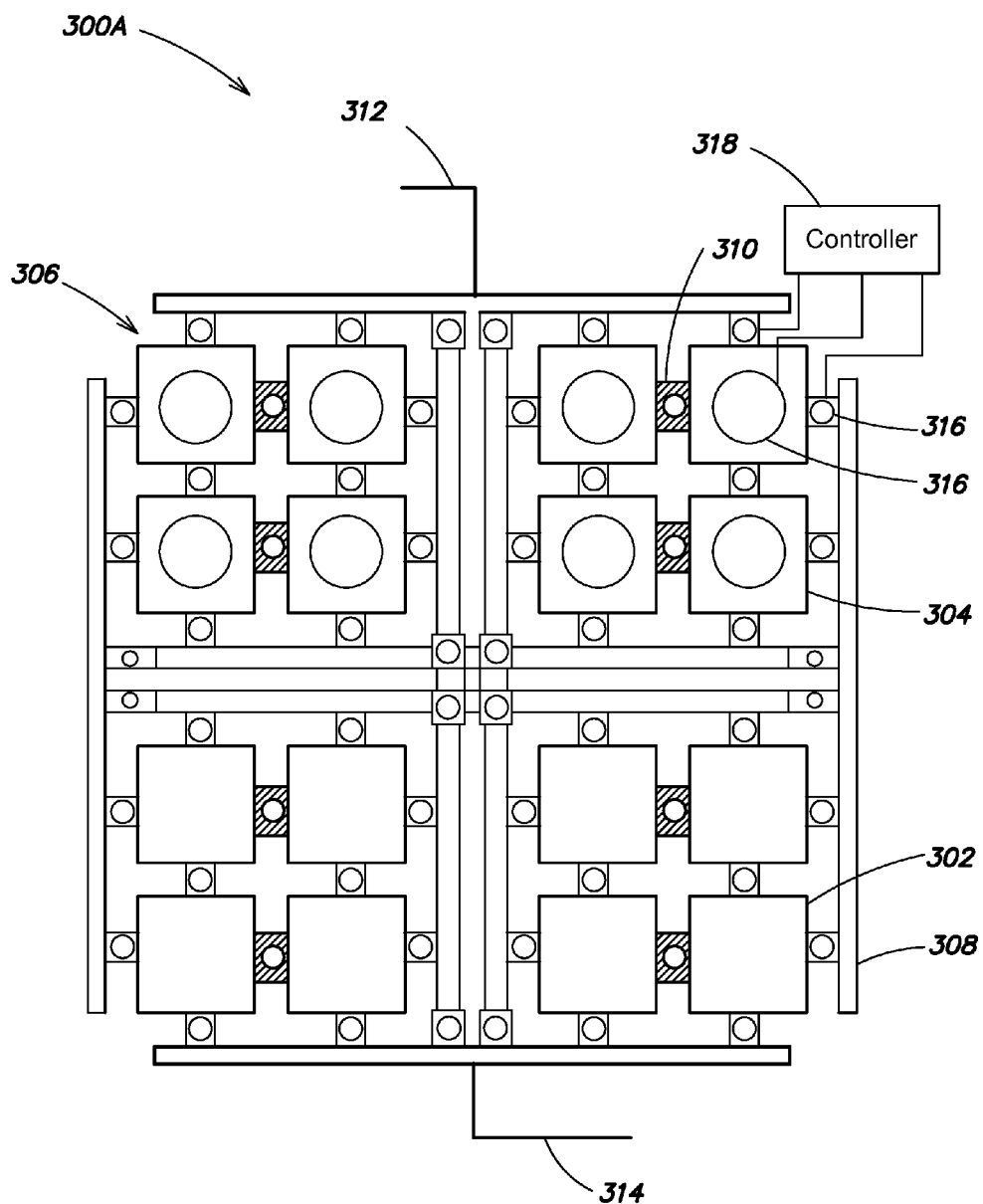
FIG. 3A is a schematic block diagram depicting an example dynamically configurable matching network according to embodiments of the present invention.

In accordance with embodiments of the present invention, an example of an inventive dynamically configurable RF matching network 300A that includes a plurality of fixed impedance components 302 and variable impedance components 304 is depicted as a schematic block diagram in FIG. 3A. The components 302, 304 (e.g., inductors, capacitors, resistors, etc.) are disposed in a compact component assembly array 306 adjacent a plurality of conductive buses 308. Between the conductive buses 308 and the components 302, 304, a configurable set of connectors 310 are provided that allow the components 302, 304 to be coupled/decoupled from the buses 308 and also allow the components 302, 304 and conductive buses 308 to be coupled together in different network topologies (e.g., L, T, Π, etc.). At least one bus 308 is coupled to an input conductor 312 and at least one bus 308 is coupled to an output conductor 314.

In some embodiments, actuators 316 are provided to control the connectors 310 and/or variable impedance components 304. The actuators 316 allow a processing controller 318 (1) to adjust the impedance of the variable impedance components 304, (2) to include or exclude any of the components 302, 304 from the circuit, and (3) to select the topology of the network. (Note that in FIG. 3A, only three connections between the controller 318 and actuators 316 are shown for clarity.)

The actuators 316 can include any practicable combination of servo-motors, hydraulic drivers, pneumatic cylinders, electronic solenoids, and the like. In some embodiments, components that include integrated actuators can be used. For example, servo-motor controlled variable capacitors can be used for the variable impedance components 304 and high-power relay switches can be used for the connectors 310.

In some embodiments, the components 302, 304 can be coupled to and decoupled from the network by physically displacing them from the bus 308 or by physically displacing one bus 308 from another. For example, a component 302 can be released or disconnected from a connector 310 and then using an actuator 316 such as a pneumatic cylinder, for example, the component 302 can be lifted away from the bus 308 to create a separation between the component and the bus 308. Likewise, two connected buses 308 can be lifted apart from each other by an actuator 316 such as a pneumatic cylinder, for example.

Figure 3B:
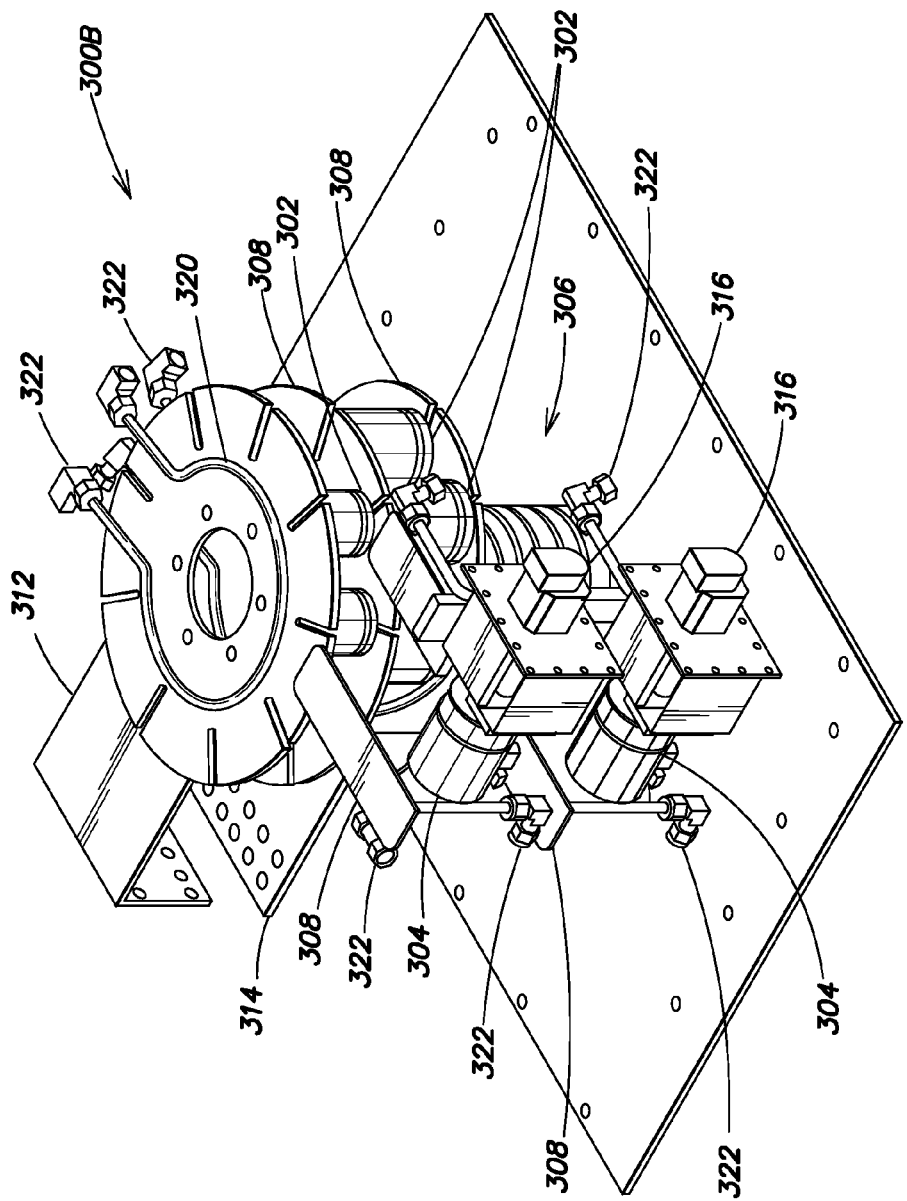
FIGS. 3B and 3C are perspective views of alternative example dynamically configurable matching networks according to embodiments of the present invention.

Turning to FIG. 3B, a perspective view of an alternative example embodiment of an inventive RF matching network 300B is depicted. Note that elements appearing in FIG. 3B that have corresponding elements in FIG. 3A are identified with the same reference numerals. The components 302, 304 (e.g., load and tune capacitors) are disposed in a component assembly array 306 adjacent a plurality of conductive buses 308. At least one bus 308 is coupled to an input conductor 312 and at least one bus 308 is coupled to an output conductor 314. In the example embodiment depicted, actuators 316 are provided to control the variable impedance components 304. Note that a controller is not shown in FIG. 3B but would be connected via control signal lines to the input of the actuators 316.

As shown in the embodiment of FIG. 3B, arrangements may be provided to cool the RF matching network 300B to prevent any overheating which may occur. Cooling may be provided by forming a fluid reservoir within the body of a bus 308 or via cooling fluid channels 320 disposed adjacent the buses 308. Note that inputs and outputs 322 are shown for the cooling fluid channels 320.

Figure 3C:
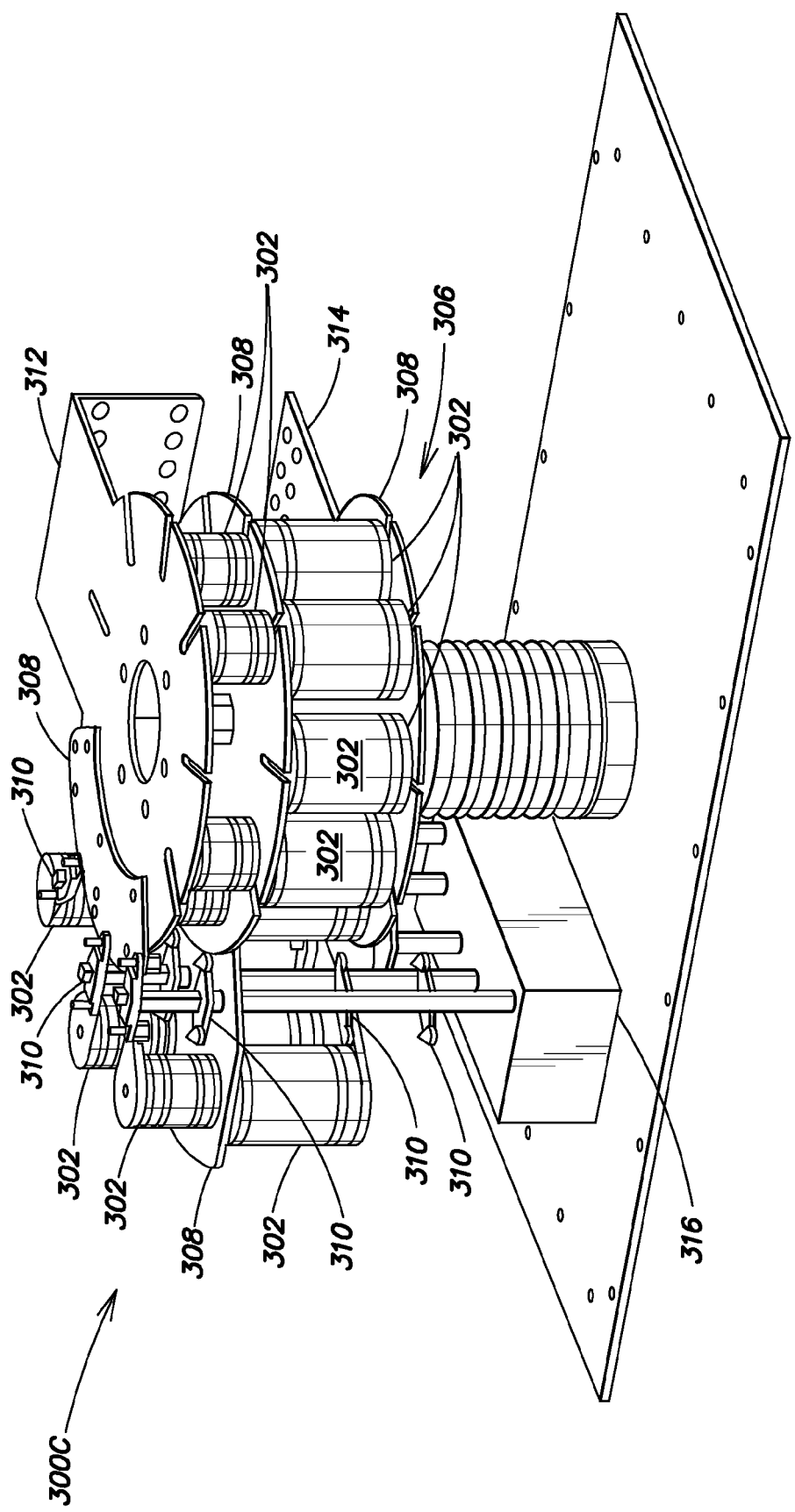

Turning to FIG. 3C, a perspective view of another alternative example embodiment of an inventive RF matching network 300C is depicted. Again note that elements appearing in FIG. 3C that have corresponding elements in FIG. 3A are identified with the same reference numerals. As with the example RF matching network 300B of FIG. 3B, the components 302 (e.g., load and tune capacitors) are disposed in a component assembly array 306 adjacent a plurality of conductive buses 308. Note that unlike the example RF matching network 300B of FIG. 3B, in the example embodiment depicted in FIG. 3C, only fixed components 302 are used. However, in other embodiments, variable components can additionally or alternatively be used.

To adjust the impedance, the example embodiment depicted in FIG. 3C provides configurable connectors 310 that allow components 302 to be added to or removed from the matching network 300C. The connectors 310 are adapted to connect or disconnect some of the buses 308 with several components coupled there to, so that the several components 302 can be concurrently added or removed from the matching network 300C in response to a control signal sent to an actuator 316. The actuator 316 in the example embodiment depicted in FIG. 3C is a pneumatic cylinder that is operative to raise (and lower) the connectors 310 to establish (or break) the electrical connections between the buses 308.

The distinction between the example RF matching network 300B of FIG. 3B and the example RF matching network 300C of FIG. 3C is that network 300B uses actuator driven variable components 304 to adjust impedance while network 300C uses actuator driven connectors 310 to add and remove fixed components 302 to adjust impedance. In other embodiments, such as in the network 300A of FIG. 3A, actuator driven connectors 310 can be used to create different network topologies (e.g., L, T, Π, etc.) for the matching network to provide even further configuration possibilities and flexibility. Further, in some embodiments, instead of coupling/decoupling banks of components 302, 304, individual components 302, 304 can be added and removed under programmatic control based on the needs of individual recipe steps.

Figure 4:
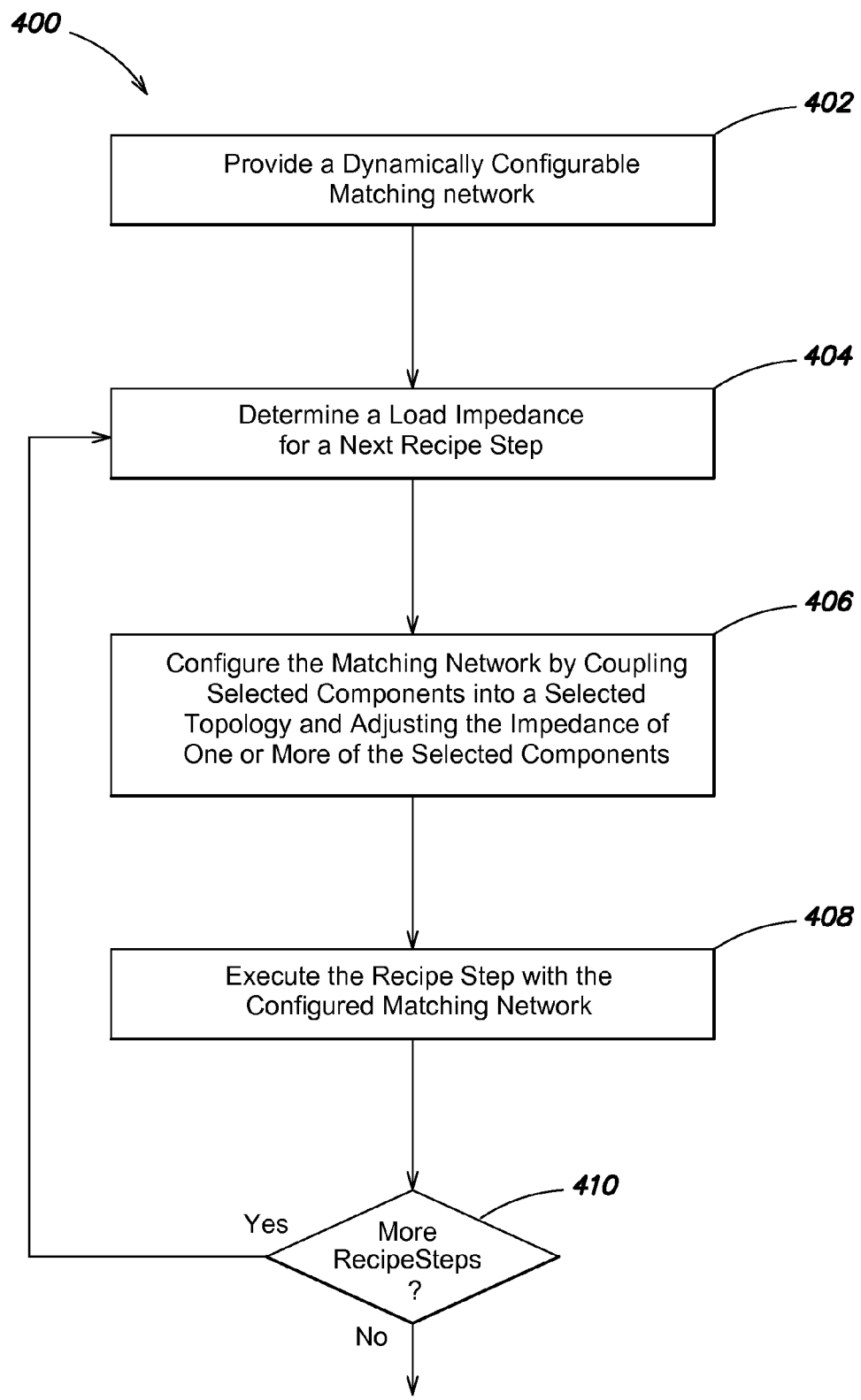
FIG. 4 is a flowchart illustrating an example method of matching a variable load impedance for multiple processing recipe steps according to embodiments of the present invention.

Turning to FIG. 4, an example method 400 of matching a variable load impedance with an RF generator output impedance for multiple processing recipe steps is depicted as a flowchart. A dynamically configurable matching network is provided that is adapted to allow configuration of included components, component impedance, and network topology (402). A load impedance is then determined for a next recipe step to be performed (404). In some embodiments, the load impedance can be determined empirically and in others it can be calculated or retrieved from a recipe database. Based on the load impedance of the recipe step, the matching network is configured by coupling selected components into a selected topology and adjusting the impedance of one or more of the selected components (406). Once the matching network is configured, the recipe step is executed (408). If there are more recipe steps to execute (410), processing returns to determining the load impedance for the next recipe step to be performed (404). Otherwise, the method 400 ends.

Accordingly, while the present invention has been disclosed in connection with exemplary embodiments thereof, it should be understood that other embodiments may fall within the spirit and scope of the invention, as defined by the following claims.

The invention claimed is:

1. A system, comprising:
a radio frequency (RF) power generator;
a processing chamber adapted to process recipe steps and presenting variable impedance loads corresponding to different recipe steps; and
a matching network coupled to the variable impedance load and the RF power generator, wherein the matching network includes a dynamically configurable component assembly array including one or more tune and load electrical components,
wherein the component assembly array is adapted to be configured for each recipe step, and at least one of the electrical components is a variable impedance component adjustable to reduce RF energy reflected from the variable impedance load for each recipe step.

2. The system of claim 1 wherein the matching network further includes one or more actuators and one or more switches, and wherein the actuators are adapted to be controlled to open and close the switches to disconnect and connect a selected set of the tune and load electrical components within the component assembly array.

3. The system of claim 2 wherein the selected set of the tune and load electrical components are selected to form a circuit adapted to match an output impedance of the RF power generator to an input impedance of the processing chamber for each recipe step.

4. The system of claim 3 further comprising a controller coupled to the actuators and adapted to control the switches to form the circuit.

5. The system of claim 4 further comprising a plurality of buses wherein the switches are each coupled to at least one of the buses and forming the circuit includes connecting the buses.

6. The system of claim 1 wherein the matching network further includes one or more actuators and one or more buses, wherein the tune and load electrical components are each coupled to at least one bus, and wherein the actuators are adapted to be controlled to disconnect and connect a selected set of the buses to form a circuit adapted to match an output impedance of the RF power generator to an input impedance of the processing chamber for each recipe step.

7. The system of claim 6 further comprising a controller coupled to the actuators and adapted to connect and disconnect the buses to form the circuit.

8. A method comprising:
providing a dynamically configurable matching network including a configurable component assembly array having one or more tune and load electrical components;
determining a load impedance for a recipe step;
configuring the matching network by coupling selected components within the component assembly array into a selected topology and adjusting the impedance of one or more of the selected components; and
executing the recipe step with the configured matching network.

9. The method of claim 8 wherein providing a dynamically configurable matching network further includes providing one or more actuators and one or more switches, and wherein configuring the matching network includes controlling the actuators to open and close the switches to disconnect and connect a selected set of the tune and load electrical components within the component assembly array.

10. The method of claim 9 further including generating actuator control signals with a controller in response to recipe step information received from a processing chamber system.

11. The method of claim 8 wherein providing a dynamically configurable matching network further includes providing one or more actuators and a plurality of busses, each tune and load component being coupled to at least one bus, and
wherein configuring the matching network includes controlling the actuators to disconnect and connect a selected set of the buses within the component assembly array to form a circuit adapted to match an output impedance of an RF power generator to an input impedance of a processing chamber system for each recipe step.

12. The method of claim 11 further including generating actuator control signals with a controller in response to recipe step information received from the processing chamber system.

13. A radio frequency (RF) matching network for matching RF energy output from an RF generator to a variable impedance load, the RF matching network comprising:
a dynamically configurable component assembly array couplable to the variable impedance load and the RF power generator, wherein the component assembly array includes one or more tune and load electrical components,
wherein the component assembly array is adapted to be configured for each recipe step, and at least one of the electrical components is a variable impedance component adjustable to reduce RF energy reflected from the variable impedance load for each recipe step.

14. The RF matching network of claim 13 wherein the component assembly array further includes one or more actuators and one or more switches, and wherein the actuators are adapted to be controlled to open and close the switches to disconnect and connect a selected set of the tune and load electrical components within the component assembly array.

15. The RF matching network of claim 14 wherein the selected set of the tune and load electrical components are selected to form a circuit adapted to match an output impedance of the RF generator to an input impedance of the variable impedance load for each recipe step.

16. The RF matching network of claim 15 further comprising a controller coupled to the actuators and adapted to control the switches to form the circuit.

17. The RF matching network of claim 15 further comprising a plurality of buses wherein the switches are each coupled to at least one of the buses and forming the circuit includes connecting the buses.

18. The RF matching network of claim 13 wherein the component assembly array further includes one or more actuators and one or more buses, wherein the tune and load electrical components are each coupled to at least one bus, and wherein the actuators are adapted to be controlled to disconnect and connect a selected set of the buses to form a circuit adapted to match an output impedance of the RF power generator to an input impedance of the processing chamber for each recipe step.

19. The RF matching network of claim 18 further comprising a controller coupled to the actuators and adapted to connect and disconnect the buses to form the circuit.

20. The RF matching network of claim 19 wherein the controller is adapted to receive recipe step data from a processing chamber system and in response, configure the component assembly array into the circuit for each recipe step.

* * * * *